(12) United States Patent
Yu et al.

(10) Patent No.: US 11,024,369 B1
(45) Date of Patent: Jun. 1, 2021

(54) STATIC RANDOM-ACCESS MEMORY CELL DESIGN

(71) Applicant: International Business Machines Corporation, Armonk, NY (US)

(72) Inventors: Lan Yu, Voorheesville, NY (US); Junli Wang, Slingerlands, NY (US); Heng Wu, Guilderland, NY (US); Ruqiang Bao, Niskayuna, NY (US); Dechao Guo, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/686,393

(22) Filed: Nov. 18, 2019

(51) Int. Cl.
*G11C 11/412* (2006.01)
*H01L 21/84* (2006.01)
*H01L 27/11* (2006.01)
*H01L 21/321* (2006.01)

(52) U.S. Cl.
CPC .......... *G11C 11/412* (2013.01); *H01L 21/845* (2013.01); *H01L 27/1104* (2013.01); *H01L 21/3212* (2013.01)

(58) Field of Classification Search
CPC ........... H01L 21/823431; H01L 21/845; H01L 21/3212; H01L 27/1104; G11C 11/412
See application file for complete search history.

(56) References Cited

U.S. PATENT DOCUMENTS

| | | | |
|---|---|---|---|
| 7,445,980 B2 | 11/2008 | Datta et al. | |
| 7,522,445 B2 | 4/2009 | Inaba | |
| 8,207,027 B2 | 6/2012 | Zhu et al. | |
| 9,418,903 B2 | 8/2016 | Divakaruni et al. | |
| 9,425,201 B2 | 8/2016 | Liaw | |
| 9,721,829 B2 | 8/2017 | Chiang et al. | |
| 10,438,855 B2* | 10/2019 | Bi | H01L 21/82341 |
| 2008/0105900 A1 | 5/2008 | Joshi et al. | |
| 2018/0005826 A1* | 1/2018 | Jacob | H01L 21/02381 |

FOREIGN PATENT DOCUMENTS

| | | |
|---|---|---|
| CN | 105826315 A | 8/2016 |
| EP | 3471144 A1 | 4/2019 |

* cited by examiner

*Primary Examiner* — Allison Bernstein
(74) *Attorney, Agent, or Firm* — Cantor Colburn LLP; Robert Sullivan

(57) ABSTRACT

6T-SRAM cell designs for larger SRAM arrays and methods of manufacture generally include a single fin device for both nFET (pass-gate (PG) and pull-down (PD)) and pFET (pull-up (PU). The pFET can be configured with a smaller effective channel width (Weff) than the nFET or with a smaller active fin height. An SRAM big cell consumes the (111) 6t-SRAM design area while provide different Weff ratios other than 1:1 for PU/PD or PU/PG as can be desired for different SRAM designs.

5 Claims, 11 Drawing Sheets

US 11,024,369 B1

STATIC RANDOM-ACCESS MEMORY CELL DESIGN

BACKGROUND

The present invention is generally directed to a semiconductor device including static random-access memory (SRAM) cell designs, and more particularly, to fin field effect transistors (finFETs) for six transistor SRAM cell designs for use in advanced technology nodes.

Transistors have been continuously scaled down in size to increase performance and reduce power consumption. This has led to the advent of more efficient, scalable electronic devices and increased user experiences. However, as transistors have decreased in size, the complexity of manufacturing them for optimal performance has increased. One area of challenge faced by manufacturers of transistors is cell layout variability for static random-access memory (SRAM) cell designs. As the cell size of SRAM shrinks, variability in design layout becomes limited.

FinFET transistor structures have been developed as an alternative to bulk-Si MOSFET structures for improved scalability. FinFET transistors generally utilize a silicon fin (rather than a planar Si surface as in MOSFETs) as the channel/body; the gate electrode straddles the fin.

SUMMARY

Embodiments of the present invention are directed to structures and methods of fabricating a semiconductor device. In one or more embodiments of the invention, a memory array includes at least one (111) six transistor static random-access memory (6T-SRAM) cell. The (111) 6T-SRAM includes a single fin pass-gate n-type doped field effect transistor, a single fin pull-down n-type doped field effect transistor, and a single fin pull-up p-type doped field effect transistor.

In one or more embodiments of the invention, a method for forming a (111) 6T-SRAM cell includes depositing a nitride layer onto a silicon substrate. A trench feature is formed in the silicon substrate to form exposed portions of the silicon substrate. A silicon germanium layer is epitaxially grown onto the exposed portions of the silicon substrate and in the trench feature. The nitride layer is selectively removed, and silicon is epitaxially grown on the silicon substrate and an exposed upper surface of the silicon germanium layer. A plurality of fins is formed by directionally etching the silicon wherein at least one of the fins includes a portion of the silicon germanium layer. The silicon substrate is subjected to p-type doping to define a pFET region corresponding to the at least one fin including the portion of the silicon germanium layer, and n-type doping to define a nFET region corresponding to the fins consisting of silicon.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

The present invention is generally directed to fin field effect transistors for static random-access memory cell designs (finFET SRAM) and processes of manufacturing the same. More particularly, the present invention is generally directed to high performance and high density 6 transistor (6T) finFET SRAM cell designs. The high performance and high density 6T-SRAM cell designs described herein provide flexible SRAM design without area penalty. As will be described in greater detail below, in one or more embodiments of the invention, the high performance and dense 6T-SRAM cell design are (111) 6T-SRAM cells including a single fin for each nFET (e.g., the pull-down (PD) transistors and the pass-gate (PG) transistors) and for each pFET (e.g., the pull-up (PU) transistors). In these embodiments of the invention, the nFET has a total 1-fin effective channel width (Weff) whereas the pFET has a smaller Weff than the 1-fin. The smaller pFET Weff can be provided by adjusting the active fin height such that the larger SRAM array can consume the dense (111) SRAM cell design area while providing different Weff ratios than 1:1 for PU/PD or PU/PG as can be desired for different applications.

Figure 1:
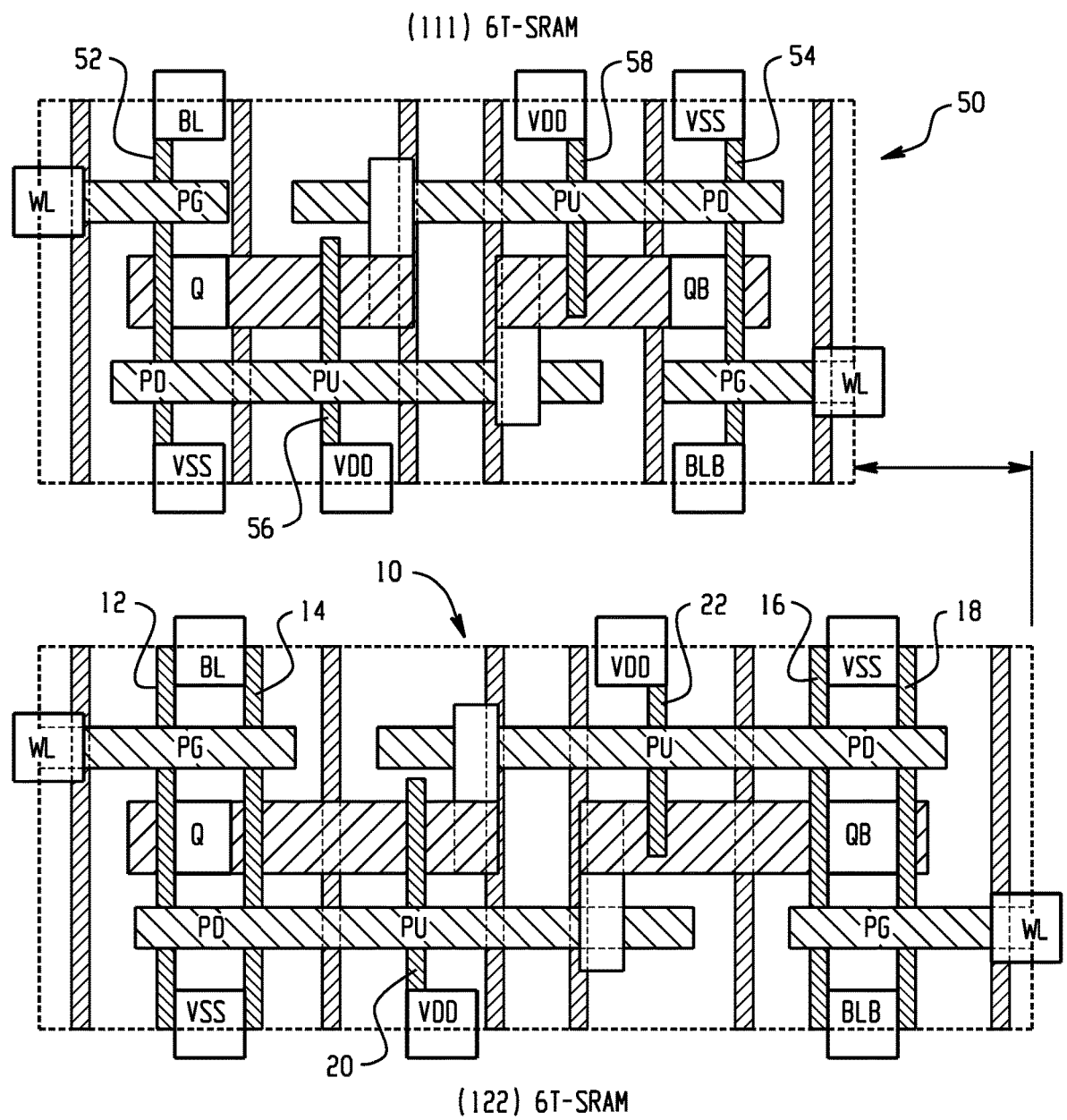
FIG. 1 are top down views comparing a prior art (122) 6T-SRAM cell and an exemplary (111) 6T-SRAM cell according to embodiments of the invention.

Prior high performance 6T-SRAM cell designs generally relied on fabricating stronger nFETs than pFETs, which was realized by utilizing more fins for the nFET than the pFET. FIG. 1 illustrates a top down view of a typical prior (122) 6T-SRAM cell design 10, which is compared to an exemplary (111) dense 6T-SRAM cell design 50 in accordance with the present invention, wherein the acronyms WL indicates a word line, BL indicates a bit line, BLB indicates a complementary bit line, VSS indicates voltage source supply, VDD indicates voltage drain discharge. Q indicates storage node and QB indicates another storage node. The illustrated (122) 6T-SRAM cell design 10 utilizes two finFETs for each nFET (finFETs 12, 14 and 16, 18 for each PG/PD, respectively), and one finFET for each pFET (single finFET 20 and 22 for each PU). In contrast, the (111) 6T-SRAM cell design 50 uses a single fin for both nFETs (single finFETs 52, 54 for each PG/PD) and pFETs (single finFETs 56, 58 for each PU), which will be described in greater detail below. As is clearly shown, the use of two finFETs for each nFET in the (122) 6T-SRAM cell design results in an increased SRAM cell area due to the presence of more finFETs per unit area relative to the exemplary (111) 6T-SRAM cell design.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Figure 2:
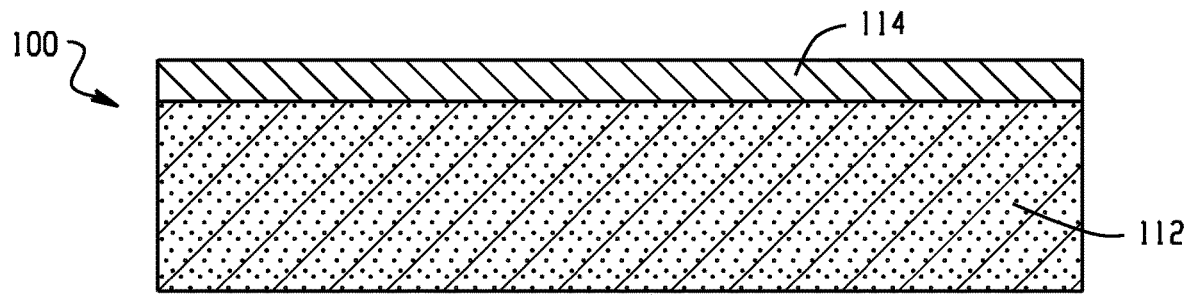
FIG. 2 is a sectional view depicting a silicon substrate subsequent to deposition of a silicon nitride layer thereon according to embodiments of the invention.

Turning now to a more detailed description of aspects of the present invention, FIG. 2 depicts a sectional view a semiconductor structure 100 including a silicon substrate 112 and a nitride layer 114 such as, for example, silicon nitride or boron nitride, deposited thereon for fabricating fins in the nFET and pFET regions such as those provided in the (111) 6T-SRAM cell design previously shown in FIG. 1.

Although reference is made to a silicon substrate, the substrate 112 can be any suitable substrate material, such as, for example, any semiconductor material including, but not limited to, Si, Ge, SiGe, SiC, SiGeC, II/IV, and III/V compound semiconductors such as, for example, InAs, GaAs, and InP. Multilayers of these semiconductor materials can also be used as substrate. In one or more embodiments of the invention, and when substrate 112 is a remaining semiconductor material portion of a bulk semiconductor substrate, the substrate 112 can be of a single crystalline semiconductor material, such as, for example, single crystalline silicon. In some embodiments of the invention, the crystal orientation of the remaining semiconductor portion of the bulk semiconductor substrate can be {100}, {110}, {111} or any other of the well-known crystallographic orientations. In some embodiments of the invention, and when substrate 112 is a remaining semiconductor material portion of a bulk semiconductor substrate. As will be described in greater detail below, each semiconductor fin can include the same semiconductor material, or a different semiconductor material, from substrate 112.

In another embodiment, substrate 112 includes at least an insulator layer of a semiconductor-on-insulator (SOI) substrate (not specifically shown). Although not specifically shown, one skilled in the art understands that an SOI substrate includes a handle substrate, an insulator layer located on an upper surface of the handle substrate, and a semiconductor layer located on an uppermost surface of the insulator layer. The handle substrate provides mechanical support for the insulator layer and the semiconductor layer. The semiconductor layer of such an SOI substrate can be processed into semiconductor fins.

The handle substrate and the semiconductor layer of the SOI substrate can include the same, or different, semiconductor material. The term "semiconductor" as used herein in connection with the semiconductor material of the handle substrate and the semiconductor layer denotes any semiconductor material including, for example, Si, Ge, SiGe, SiC, SiGeC, II/VI, and III/V compound semiconductors such as, for example, InAs, GaAs, or InP. Multilayers of these semiconductor materials can also be used as the semiconductor material of the handle substrate and the semiconductor layer. In one or more embodiments of the invention, the handle substrate and the semiconductor layer are both formed of silicon. In some embodiments of the invention, the handle substrate is a non-semiconductor material including, for example, a dielectric material and/or a conductive material. In yet other embodiments of the invention, the handle substrate can be omitted and the substrate 104 includes only an insulator layer.

In one or more embodiments of the invention, the handle substrate and the semiconductor layer can have the same or different crystal orientation. For example, the crystal orientation of the handle substrate and/or the semiconductor layer can be {100}, {110}, or {111}. Other crystallographic orientations besides those specifically mentioned can also be used in the present application. The handle substrate and/or the semiconductor layer of the SOI substrate can be a single crystalline semiconductor material, a polycrystalline material, or an amorphous material. Typically, at least the semiconductor layer is a single crystalline semiconductor material.

Figure 3:
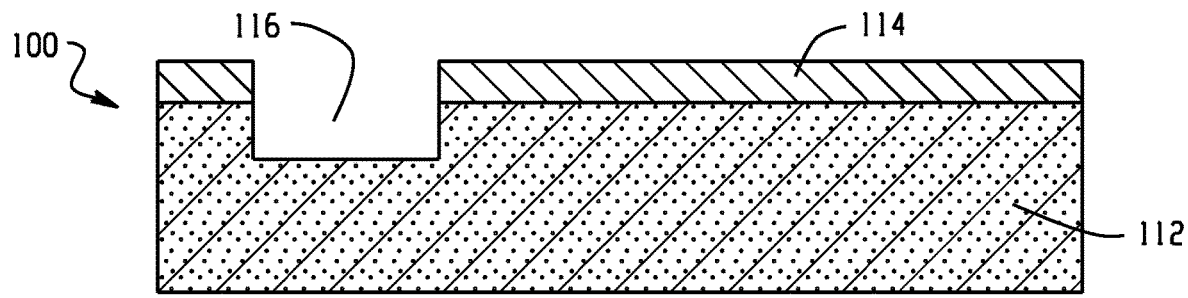
FIG. 3 is a sectional view of FIG. 2 subsequent to patterning of a trench feature into the silicon substrate according to embodiments of the invention.

In FIG. 3, a trench feature 116 is formed and generally corresponds to where the pFET fin will be formed. As will be discussed in greater detail, the depth of the trench feature can be used to control the final Weff of the pFET for SRAM. The trench feature 166 can be formed by selectively patterning the nitride layer to form an opening therein followed by an anisotropic etch. The etching apparatus used in carrying out the anisotropic etch can include any commercially available reactive ion etching (RIE) apparatus, or magnetically enhanced reactive ion etching (MERIE) apparatus, capable of supporting a wafer of the size desired to be etched in which gases of the type used herein can be introduced at the flow rates to be discussed and a plasma maintained at the power levels required for the process. Such apparatus will be generally referred to herein as RIE apparatus, whether magnetically enhanced or not. Examples of such commercially available apparatus include the Precision 5000 magnetically enhanced reactive ion etcher available from Applied Materials, Inc.; the Rainbow reactive ion etcher by Lam; the reactive ion apparatus by Tegal Company; the Quad reactive ion etcher by Drytek, and reactive ion exchange tools available from Tokyo Electron Limited.

By way of example, the trench feature 116 can formed by optical lithography and etching. The lithographic step can include forming a photoresist (organic, inorganic or hybrid) atop the nitride layer on the substrate. The photoresist can be formed using conventional deposition techniques such chemical vapor deposition, plasma vapor deposition, sputtering, dip coating, spin-on coating, brushing, spraying and other like deposition techniques can be employed. Following formation of the photoresist, the photoresist is exposed to a desired pattern of radiation such as X-ray radiation, extreme ultraviolet (EUV) radiation, electron beam radiation or the like. Next, the exposed photoresist is developed utilizing a conventional resist development process.

After the development step, the etching step can be performed to transfer the pattern from the patterned photoresist into the interlayer dielectric. The etching step used in forming the at least one opening can include a dry etching process (including, for example, reactive ion etching, ion beam etching, plasma etching or laser ablation), a wet chemical etching process or any combination thereof.

Figure 4:
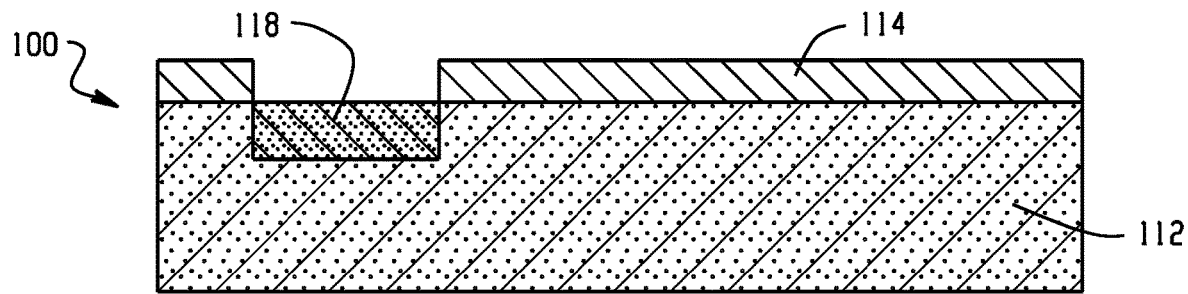
FIG. 4 is a sectional view of FIG. 3 subsequent to epitaxial growth of silicon germanium in the trench feature according to embodiments of the invention.

FIG. 4 depicts a sectional view of the structure 100 of FIG. 3 subsequent to epitaxial growth of a silicon-germanium (SiGe) layer 118 on the exposed surfaces of the silicon substrate, i.e., epitaxial growth of the SiGe layer within the trench feature 116 as shown. Epitaxial growth is selective and does not form on the non-crystalline silicon nitride surface.

The SiGe layer can be epitaxiall formed, for example, by a selective epitaxial process using a combination of silicon-containing gas, a germanium-containing gas, a carrier gas, and optionally, an etchant gas. The silicon containing gas can be a gas such as silane ($SiH_4$), dichlorosilane ($SiH_2Cl_2$), disilane ($Si_2H_6$), trisilane ($Si_3H_8$) or tetrasilane ($Si_4H_{10}$). The germanium containing gas can be a gas such as germane ($GeH_4$) or digermane ($Ge_2H_6$). The carrier gas can be a gas such as nitrogen, hydrogen, or argon. The optional etchant gas can be a gas such as hydrogen chloride (HCl) or chlorine ($Cl_2$). The formation can occur at a temperature ranging from about 450° C. to about 900° C. The SiGe layer can have a Ge concentration of about 15% to about 100% in one or more embodiments of the invention, a Ge concentration from about 20% to about 60% in other embodiments of the invention, and a Ge concentration from about 20% to about 40% in still other embodiments of the invention.

Figure 5:
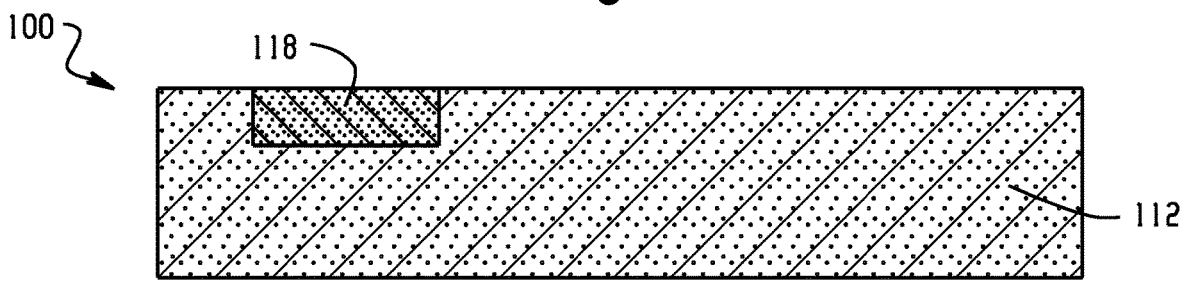
FIG. 5 is a sectional view of FIG. 4 subsequent to a planarization process to remove the silicon nitride layer according to embodiments of the invention.

FIG. 5 depicts a sectional view of the structure 100 of FIG. 4 subsequent to planarization to the silicon germanium layer 118 effectively removing the nitride layer 114 from the substrate 112. The planarization process can include, for example, a chemical mechanical polishing (CMP) process, which planarizes the surface of the interconnect structure by a combination of chemical and mechanical forces generally known in the art. By way of example, CMP can remove material through the physical grinding of a slurry containing abrasive particles such as silica, as well as through chemical action as a result of oxidizing agents such as hydrogen peroxide contained in the slurry.

Figure 6:
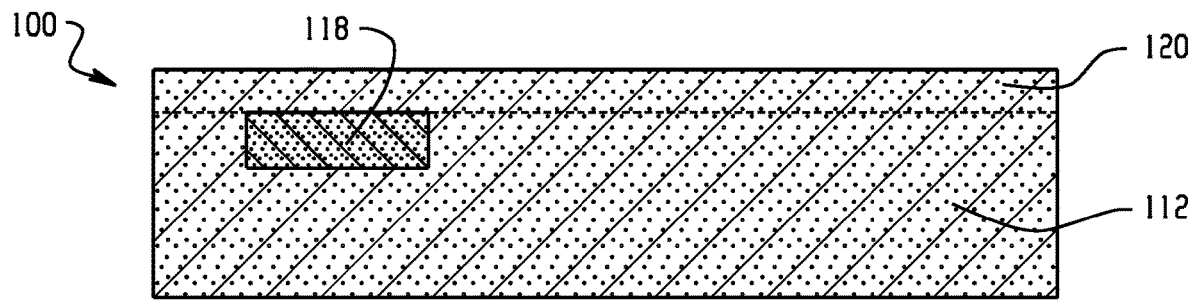
FIG. 6 is a sectional view of FIG. 5 subsequent to epitaxial growth of silicon according to embodiments of the invention.

FIG. 6 depicts a sectional view of the structure 100 of FIG. 5 subsequent to epitaxial growth of a crystalline silicon layer 120 onto the substrate 112, which embeds the silicon germanium layer 118.

Figure 7:
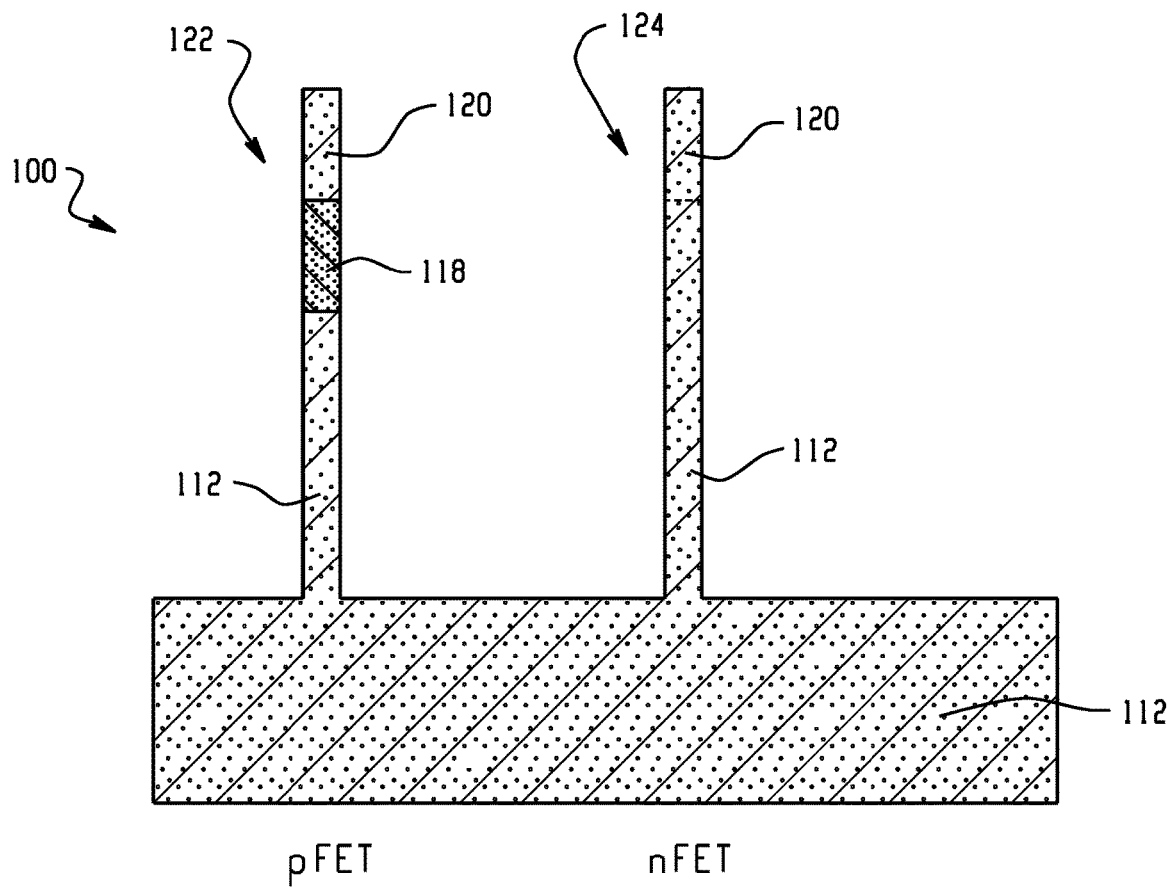
FIG. 7 is a sectional view of FIG. 6 subsequent to a directional etch process to form fins according to embodiments of the invention.

FIG. 7 depicts a sectional view of the structure 100 of FIG. 6 subsequent to a directional etch process using RIE, for example, to further define fins 122, 124. Fin 122 will be utilized in the pFET region and fin 124 will be utilized in the nFET. The fins 122, 124 formed in this manner can be used for forming the fins used in the (111) 6T-SRAMcell design such as that previously shown in FIG. 1.

Figure 8:
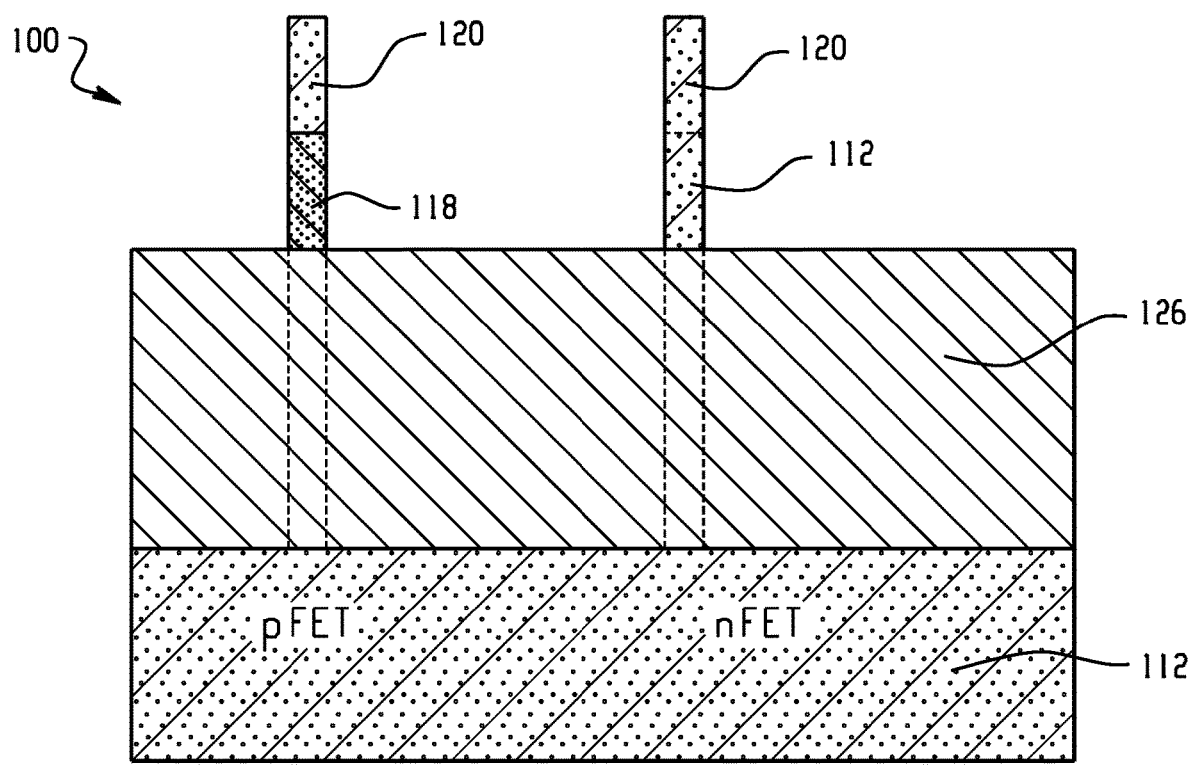
FIG. 8 is a sectional view of FIG. 7 subsequent to an oxide deposition to reveal the fins according to embodiments of the invention.

FIG. 8 depicts a sectional view of the structure 100 of FIG. 6 subsequent to deposition of an isolation layer 126 such as an oxide. The isolation layer can be etched back exposing at least a portion of the fins 122, 124 stopping at silicon 112 underlying the silicon germanium portion 118 in fin 122. Any etch with good uniformity and etch rate control can be employed. By way of example, the oxide layer can be recessed with are etchant including a fluorine ion, such as HF. In some embodiments of the invention, isolation layer 126 is recessed using a commonly known anisotropic etch, such as a plasma or reactive ion etch (RIE) process using an etchant gas such as, but not limited to, hexafluorethane ($C_4F_6$). In a further embodiment, an anisotropic etch can be followed by an isotropic etch, such as a commonly known dry process using a gas such as nitrogen trifluoride ($NF_3$), or a wet chemical etch such as hydrofluoric acid (HF), to completely remove isolation from at least a portion of the fin sidewalls. Alternatively, only a portion of the unprotected isolation layer is removed during the recess etch.

Figure 9:
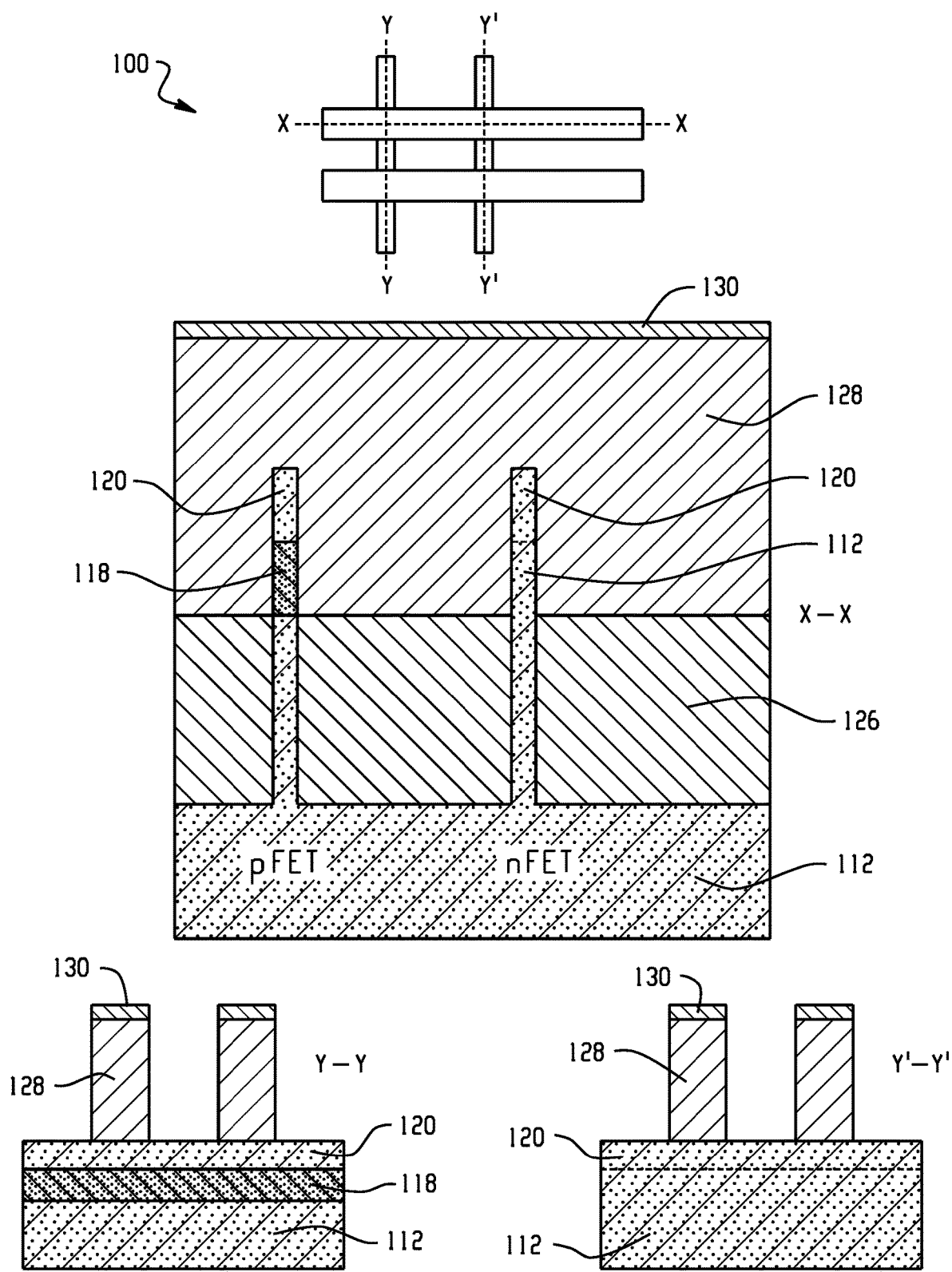
FIG. 9 depicts a top down view and sectional views taken along lines X-X, Y-Y and Y'-Y' of the structure of FIG. 8 subsequent to post dummy PC directional etch according to embodiments of the invention.

FIG. 9 provides a top down view and sectional views taken along lines X-X, Y-Y (pFET) and Y'-Y' (nFET) of the structure of FIG. 8 subsequent to a dummy PC RIE process for forming gate stack 128. Any known composition and manner of forming the gate stack 128 can be utilized. For example, the gate stack can be formed by blanket depositing a gate electrode material over the substrate and then patterning the gate electrode material. The gate electrodes can include metals such as, but not limited to, tungsten, tantalum nitride, titanium nitride or titanium silicide, nickel silicide, or cobalt silicide. In still other embodiments of the invention, the gate electrode includes silicides. In other embodiments of the present invention, the gate electrode can be formed using "replacement gate" methods. In such embodiments of the invention, the gate electrode utilizes a fill and polish technique similar to those commonly employed in damascene metallization technology.

The gate stack 128 can include a deposited dielectric or a grown dielectric and a gate electrode. In an embodiment of the present invention, the gate dielectric layer is a silicon dioxide dielectric film grown with a dry/wet oxidation process. In an embodiment of the present invention, the gate dielectric is a deposited high dielectric constant (high-K) metal oxide dielectric, such as, but not limited to, tantalum pentaoxide, titanium oxide, hafnium oxide, zirconium oxide, aluminum oxide, or another high-K dielectric, such as barium strontium titanate, (BST). The high-K dielectric film can be formed by well-known techniques, such as chemical vapor deposition (CVD) and atomic layer deposition (ALD). A hardmask 130 can be used to pattern the gate stacks 128.

Figure 10:
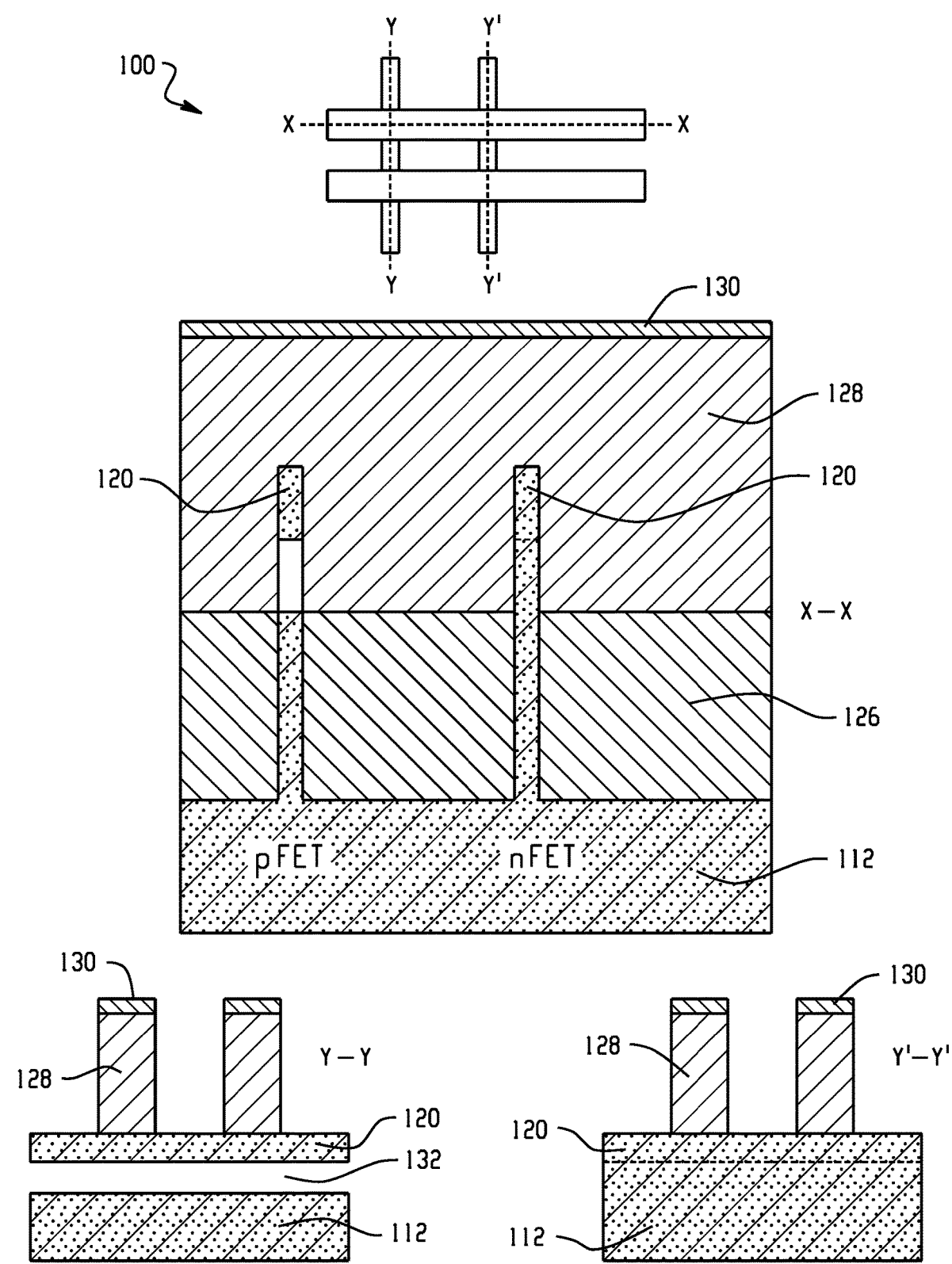
FIG. 10 depicts a top down view and sectional views taken along lines X-X, Y-Y and Y'-Y' of the structure of FIG. 9 subsequent to selective silicon germanium release according to embodiments of the invention.

FIG. 10 provides a top down view and sectional views taken along lines X-X, Y-Y (pFET) and Y'-Y' (nFET) of the structure of FIG. 9 subsequent to selective release of the silicon-germanium in fin 122 to form a space 132. Selective release of the silicon 118 can include a dry or wet etch process. By way of example, the silicon germanium layer can be removed by exposure to gaseous hydrochloric acid.

Figure 11:
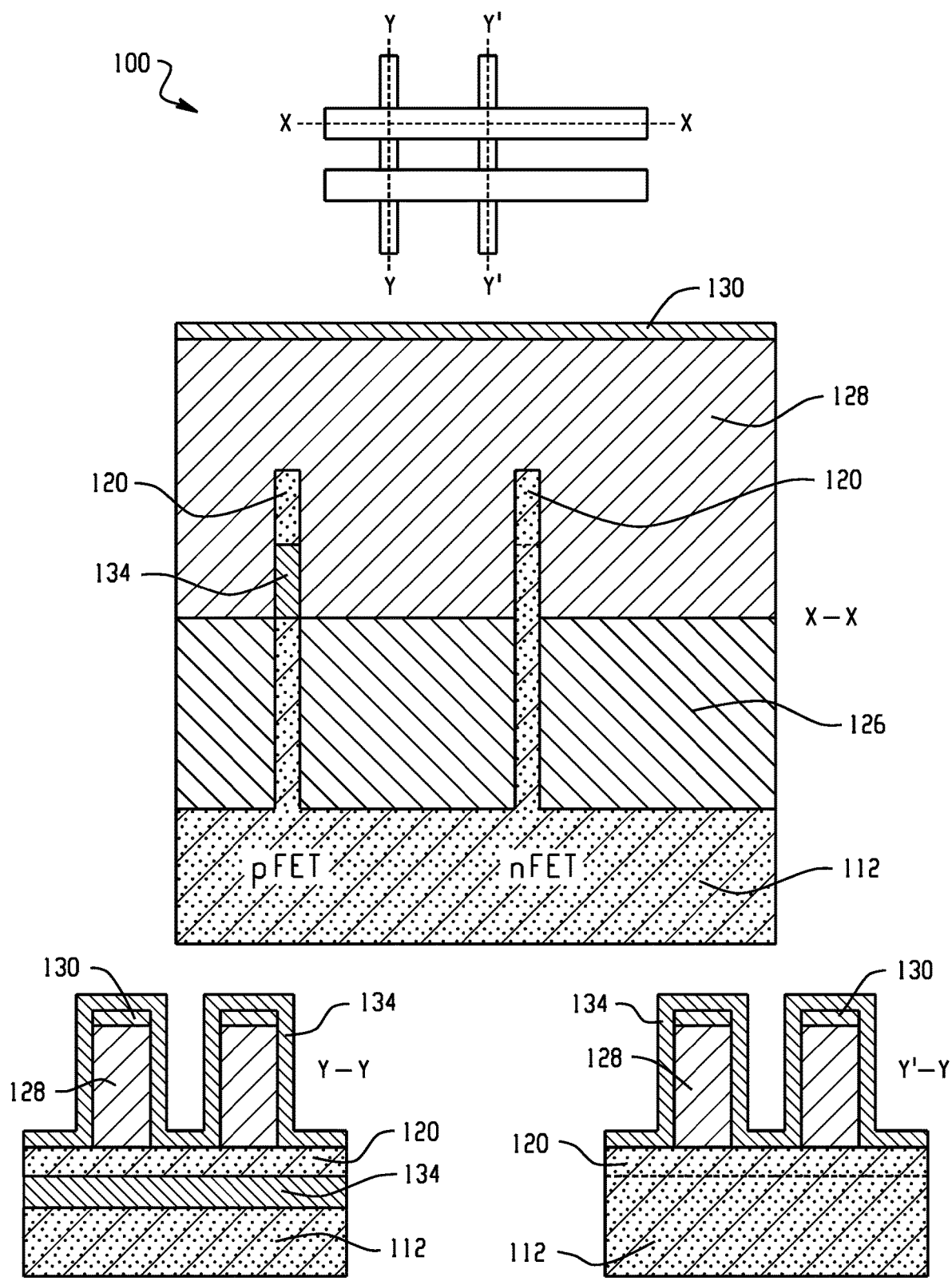
FIG. 11 depicts a top down view and sectional views taken along lines X-X, Y-Y and Y'-Y' of the structure of FIG. 10 subsequent to deposition of a conformal spacer layer according to embodiments of the invention.

FIG. 11 provides a top down view and sectional views taken along lines X-X, Y-Y (pFET) and Y'-Y' (nFET) of the structure of FIG. 10 subsequent to atomic layer deposition of a spacer material into the space 132 and about the gate stack 128 to form a conformal spacer layer 134.

Figure 12:
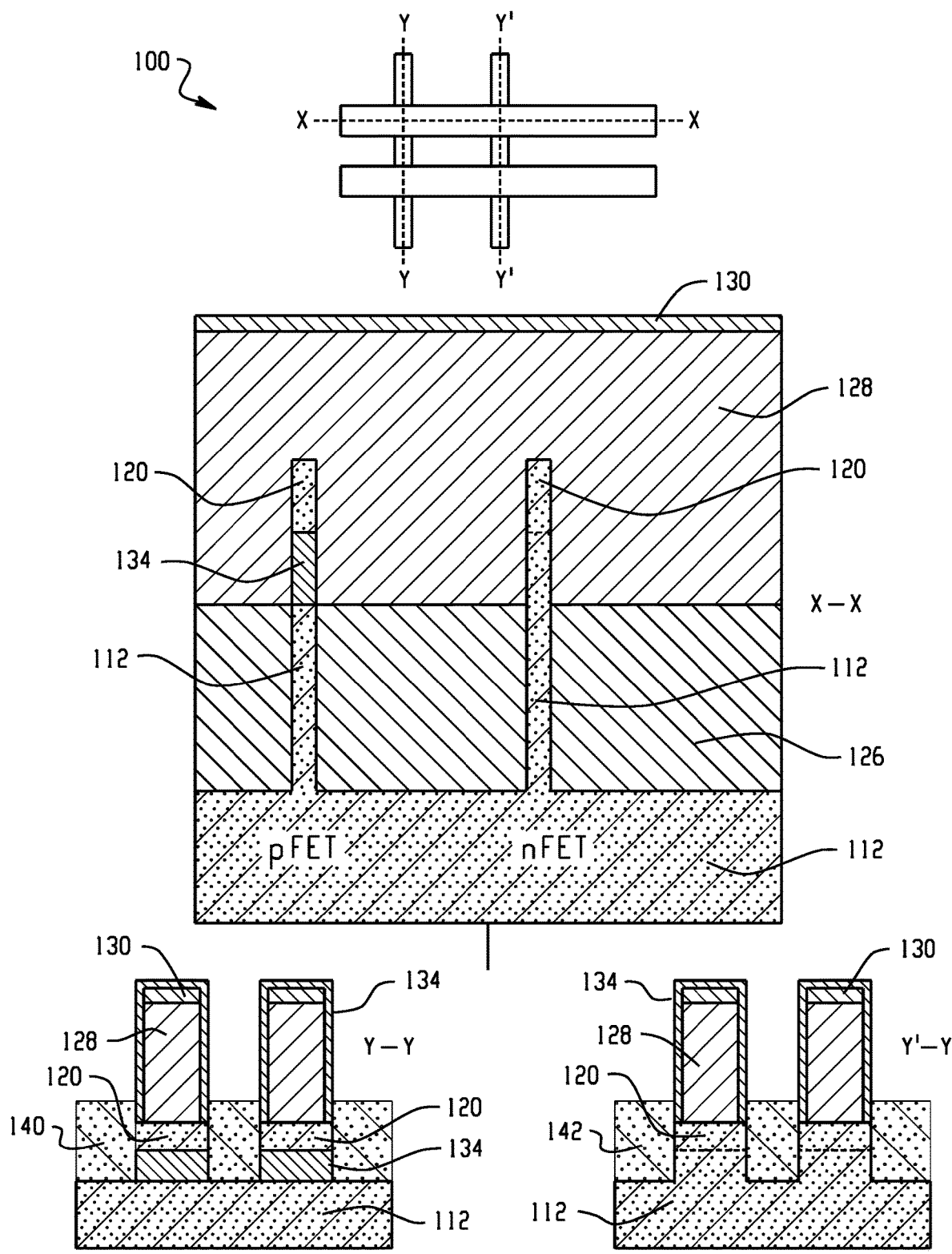
FIG. 12 depicts a top down view and sectional views taken along lines X-X, Y-Y and Y'-Y' of the structure of FIG. 11 subsequent to spacer pull-down, fin recess and epitaxial growth processing according to embodiments of the invention.

FIG. 12 provides a top down view and sectional views taken along lines X-X, Y-Y (pFET) and Y'-Y' (nFET) of the structure of FIG. 11 subsequent to spacer pull-down, fin recess and epitaxial growth. The spacer pull-down and fin recess formation include anisotropically etching the spacer layer 134 to the silicon 120 between fins 122, 124 to remove the spacer layer followed by further etching to silicon 112. A RIE process can be used for the spacer pull-down and fin recess formation 134.

A single-crystalline silicon layer is then epitaxially grown on the exposed silicon 112, which is subsequently doped to form source and drain regions 140, 142 adjacent the channel region. For the pFET transistor provided in the sectional view Y-Y, the silicon 140 is doped to p-type conductivity and to a concentration of $1\times10^{19}$-$1\times10^{21}$ atoms/cm$^3$. For the nFET transistor provided in the sectional view Y'-Y', the silicon is doped with n-type conductivity ions to a concentration of $1\times10^{19}$-$1\times10^{21}$ atoms/cm$^3$. It should be apparent that in the case of a pFET S/D epi, the semiconductor material can be heavily doped with p-type dopants, such as B whereas for nFET S/D epi, the semiconductor material can be heavily doped with n-type dopants, such as P, As, and the like.

Figure 13:
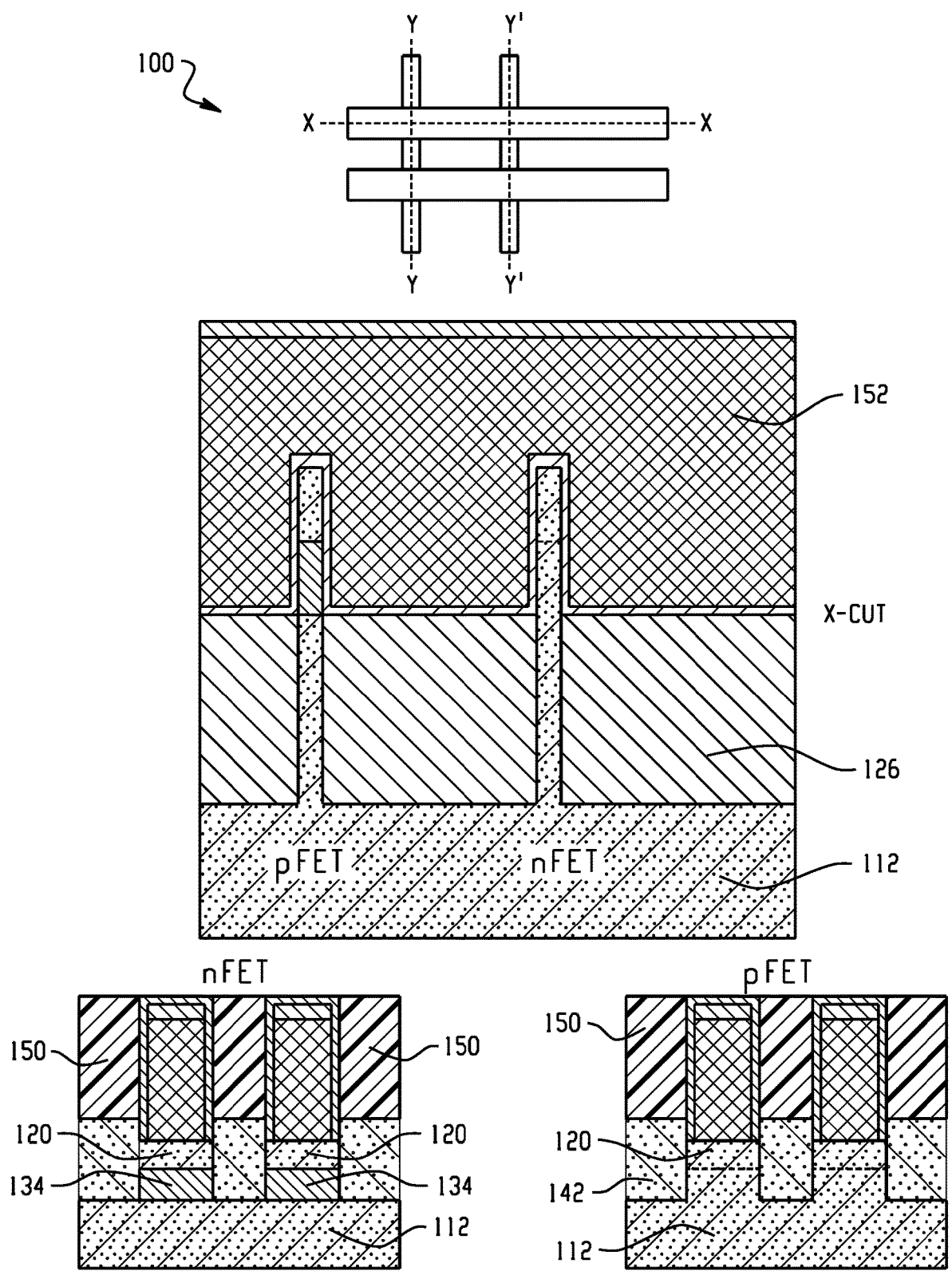
FIG. 13 depicts a top down view and sectional views taken along lines X-X, Y-Y and Y'-Y' of the structure of FIG. 12 subsequent to deposition of a dielectric layer to form the (111) 6T-SRAM cell according to embodiments of the invention.

FIG. 13 provides a top down view and sectional views taken along lines X-X, Y-Y and Y'-Y' of the structure of FIG. 12 subsequent to deposition of an interlayer dielectric 150 and metal gate 152 to form the final structure, which is suitable of use for integration into a (111) 6T-SRAM cell. In this embodiment, the pFET Weff is adjusted by active fin height, which as described above can be easily adjusted for different applications by changing the depth of the trench opening provided in FIG. 3.

Figure 14:
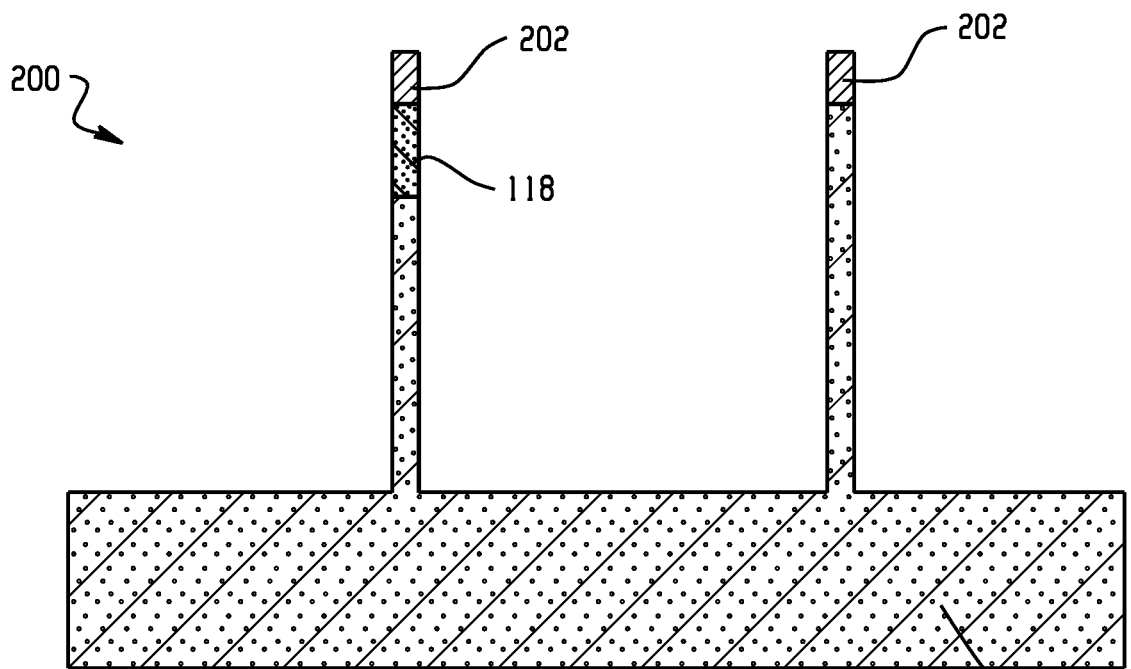
FIG. 14 depicts a sectional view of the structure of FIG. 5 subsequent to a directional etch process according to embodiments of the invention.

In one or more other embodiments of the invention, the pFET Weff can be adjusted by changing the physical height of the fin relative to nFET fins in the (111) 6T-SRAM. FIG. 14 provides a sectional view of the structure of FIG. 5 subsequent to deposition and patterning a hardmask layer 202 to form fins 210, 220 for the pFET and nFET regions. Using the patterned hardmask layer 202, a RIE etch process can be used to directional etch the silicon 112 (and the silicon germanium layer, where indicated) to form the fins.

Figure 15:
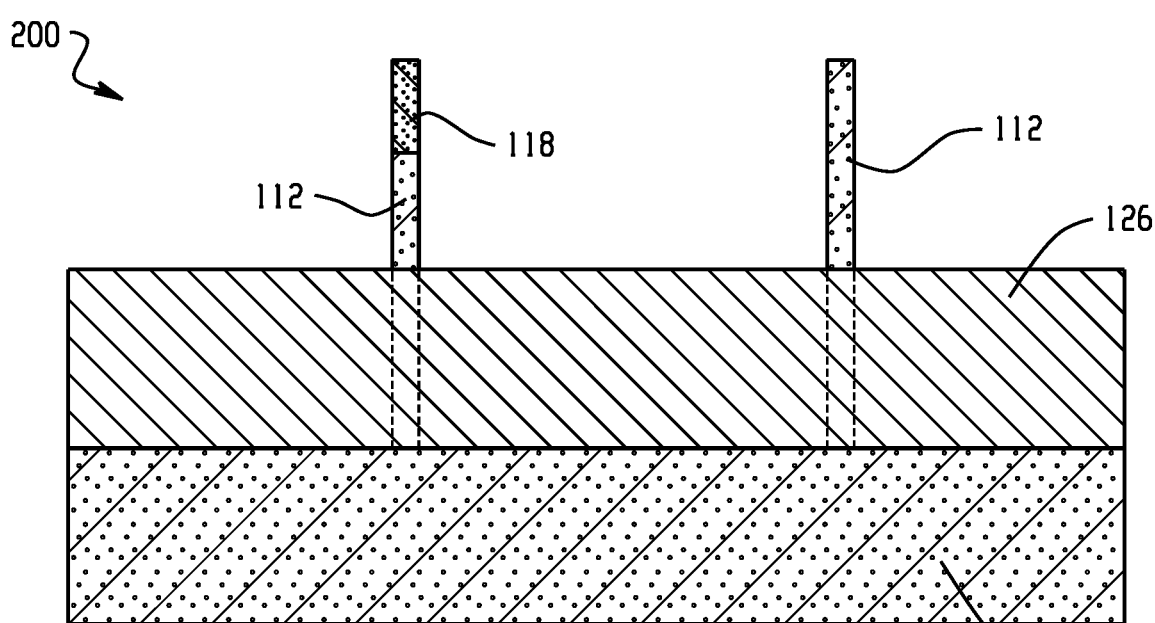
FIG. 15 depicts a sectional view of the structure of FIG. 14 subsequent to fin reveal according to embodiments of the invention.

FIG. 15 provides a sectional view of the structure of FIG. 14 subsequent to oxide deposition and fin reveal after etching the oxide layer 126. The hardmask layer 202 is also removed during the etching process.

Figure 16:
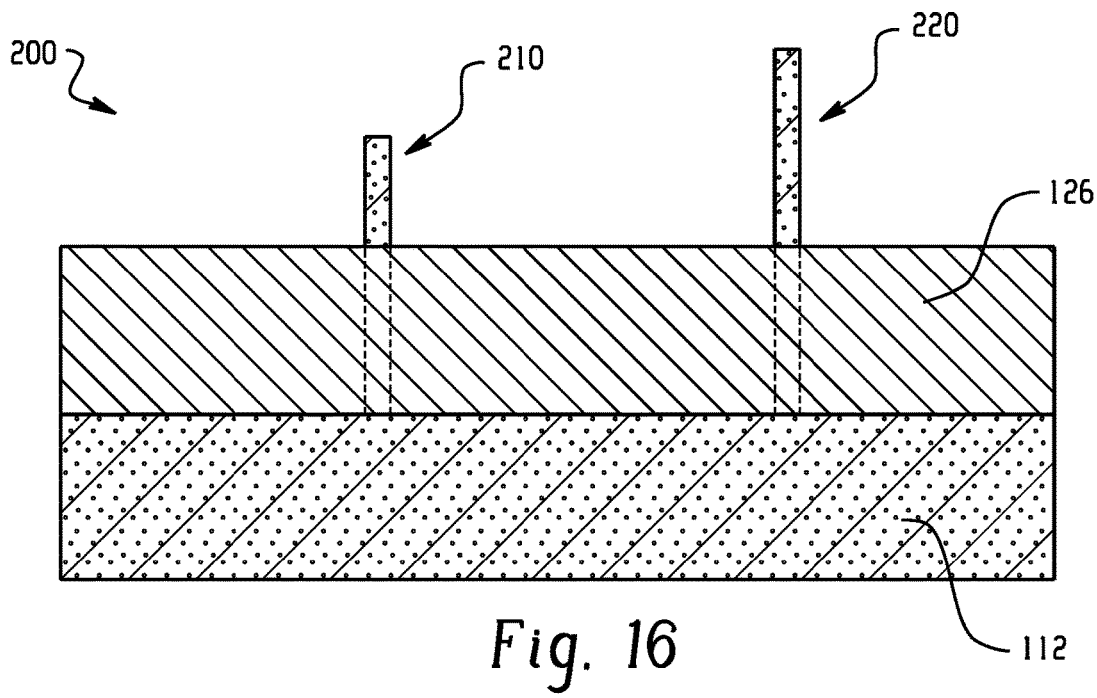
FIG. 16 depicts a sectional view of the structure of FIG. 15 subsequent to selective removal of the silicon germanium layer according to embodiments of the invention.

FIG. 16 provides a sectional view of the structure of FIG. 16 subsequent to wet or dry etching to selectively remove the silicon germanium layer 118. For example, the structure 200 can be exposed to gaseous hydrochloric acid for a period of time effective to remove the silicon germanium 118. By removing the silicon germanium layer, the height of the fin 210 is less than the height of fin 220, i.e., fin 210 has a smaller Weff than fin 220. The etching process generally depends on temperature, pressure, time, ratio of HCl to germane, and the like. Modification of these parameters is well within the ordinary skill of those in the art.

Figure 17:
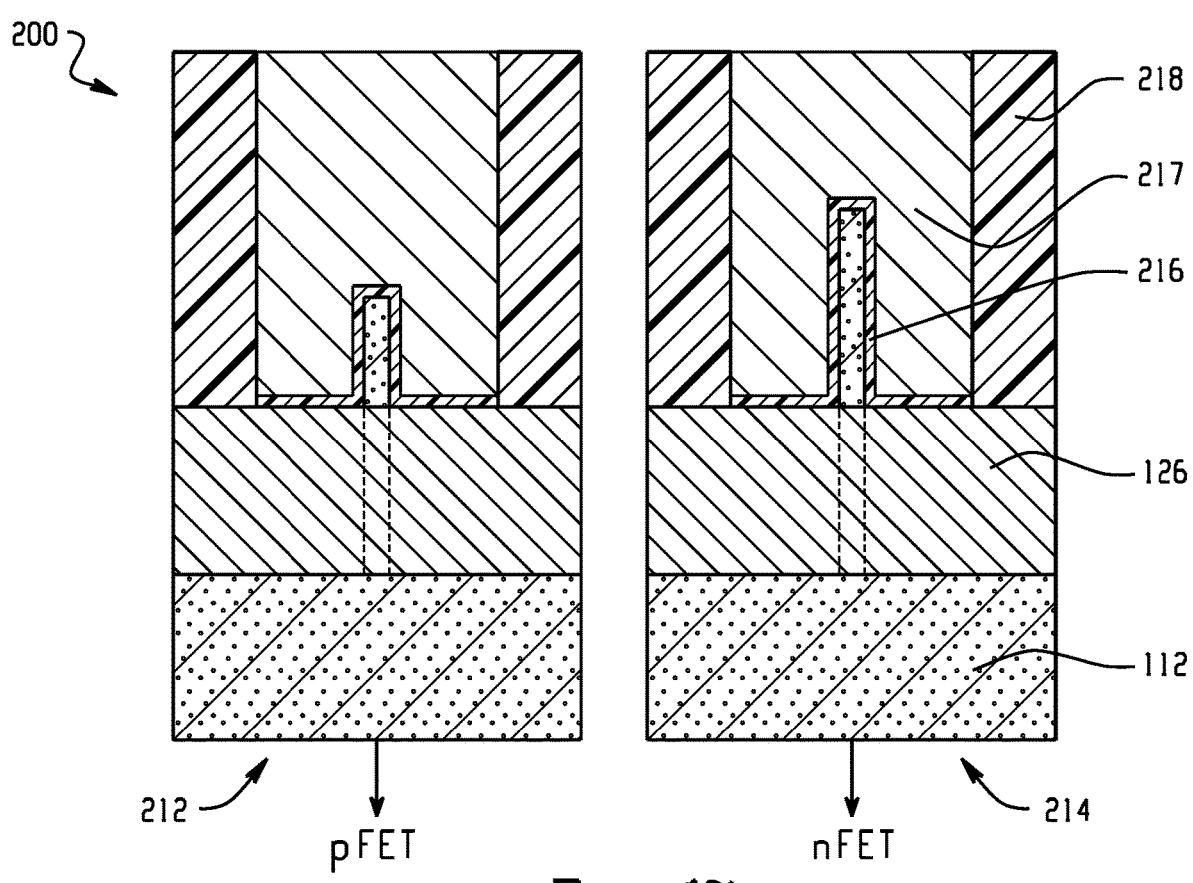
FIG. 17 depicts a sectional view of the structure of FIG. 16 subsequent to forming the gate structure according to embodiments of the invention.

FIG. 17 provides a sectional view of the structure of FIG. 16 subsequent to completing formation of the transistors in the pFET and nFET regions 212, 214, respectively. The transistors further include a high k dielectric 216, metal gate 217, and interlayer dielectric 218 using known processes. As noted above, the pFET region 212 has a smaller Weff than the 1-fin in the nFET region 214.

Advantageously, the 6T-SRAM cell design in accordance with the present invention as is generally described above provides a single fin for both nFET (PG/PD) and pFET (PU), e.g., a (111) 6T-SRAM cell design, wherein the Weff can be adjusted as can be desired for different applications. For example, the pFET can be provided with a smaller Weff than 1-fin and/or can be adjusted by active fin height. Consequently, the SRAM big cell consumes (111) design area but provides different Weff ratios than 1:1 for PU/PD or PU/PG. The flexible SRAM Weff design provides high performance and is without area penalty The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a (111) six transistor static random-access memory (6T-SRAM) cell comprising: depositing a nitride layer onto a silicon substrate; forming a trench feature in the silicon substrate to form exposed portions of the silicon substrate; epitaxially growing a silicon germanium layer onto the exposed portions of the silicon substrate in the trench feature; selectively removing the nitride layer; epitaxially growing silicon onto the silicon substrate and an exposed upper surface of the silicon germanium layer; directionally etching the silicon to form a plurality of fins, wherein at least one of the fins comprises a portion of the silicon germanium layer; and subjecting the silicon substrate to p-type doping to define a pFET region corresponding to the at least one fin comprising the portion of the silicon germanium layer and n-type doping to define a nFET region corresponding to the fins consisting of silicon.

2. The method of claim 1, wherein selectively removing the nitride layer comprises a chemical planarization process.

3. The method of claim 1, wherein the trench feature has a depth that controls an effective channel width of the fin comprising the portion of the silicon germanium layer.

4. The method of claim 1 further comprising selectively removing the silicon germanium layer to change a height of the fin in the pFET region relative to a height of the fin in the nFET region, wherein the height of the fin in the pFET region is less than the height of the fin in the nFET region.

5. The method of claim 1, wherein the at least one fin comprising the portion of the silicon germanium layer in the pFET region is in a single fin pull-up transistor configuration and the fins consisting of silicon in the nFET region are in single fin pull-down and single fin pass-gate transistor configurations.

\* \* \* \* \*